US009990737B2

(12) United States Patent
Weber et al.

(10) Patent No.: US 9,990,737 B2
(45) Date of Patent: Jun. 5, 2018

(54) APPARATUS AND METHOD FOR CORRELATING IMAGES OF A PHOTOLITHOGRAPHIC MASK

(71) Applicant: Carl Zeiss SMT GmbH, Oberkochen (DE)

(72) Inventors: Dieter Weber, Rossdorf (DE); Markus Waiblinger, Darmstadt (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days. days.

(21) Appl. No.: 14/568,681

(22) Filed: Dec. 12, 2014

(65) Prior Publication Data
US 2015/0169997 A1 Jun. 18, 2015

(30) Foreign Application Priority Data
Dec. 13, 2013 (DE) .................. 10 2013 225 936

(51) Int. Cl.
G06K 9/00 (2006.01)
G06T 7/40 (2017.01)
H01J 37/26 (2006.01)
G06T 7/00 (2017.01)
G06T 11/60 (2006.01)
G02B 21/00 (2006.01)
G01Q 30/02 (2010.01)
G01Q 30/04 (2010.01)
G06K 9/46 (2006.01)

(52) U.S. Cl.
CPC .............. G06T 7/40 (2013.01); G01Q 30/02 (2013.01); G01Q 30/04 (2013.01); G02B 21/008 (2013.01); G06T 7/0008 (2013.01); G06T 11/60 (2013.01); H01J 37/26 (2013.01); G06K 2009/4666 (2013.01); H01J 2237/2583 (2013.01); H01J 2237/2817 (2013.01); H01J 2237/31744 (2013.01)

(58) Field of Classification Search
CPC ...... G01Q 30/02; G01Q 30/04; G02B 21/008; H01J 2237/2817; H01J 37/26; G06T 7/30–7/38; G06T 3/0068–3/0081
See application file for complete search history.

(56) References Cited

U.S. PATENT DOCUMENTS

| 5,214,282 A | 5/1993 | Yamaguchi et al. |
| 2005/0226494 A1 | 10/2005 | Yamamoto et al. |
| 2014/0165236 A1* | 6/2014 | Budach ............ G03F 1/22 850/9 |

FOREIGN PATENT DOCUMENTS

| DE | 10 2011 079 382 | 1/2013 | ............ G03F 1/72 |
| JP | H04-034824 | 2/1992 | ............ H01J 37/305 |
| JP | 2011-017705 | 1/2011 | ............ G01N 21/956 |

(Continued)

OTHER PUBLICATIONS

Japanese Office Action for Japanese Application No. 2014-252222 dated Jan. 12, 2016 (8 pages).

Primary Examiner — Mark Roz
(74) Attorney, Agent, or Firm — Fish & Richardson P.C.

(57) ABSTRACT

An apparatus for correlating at least two images of a photolithographic mask that at least partially overlap, in which the apparatus includes a correlation unit that is provided to use at least one random variation, which is present in the at least two images, of at least one structural element of the photolithographic mask for the correlation of the at least two images.

35 Claims, 10 Drawing Sheets

(56) References Cited

FOREIGN PATENT DOCUMENTS

| WO | WO 2012/146647 | 11/2012 | ............ H01J 37/304 |
| WO | WO 2013/010976 | 1/2013 | ............... G03F 1/22 |

\* cited by examiner

APPARATUS AND METHOD FOR CORRELATING IMAGES OF A PHOTOLITHOGRAPHIC MASK

CROSS-REFERENCE TO RELATED APPLICATION

Under 35 U.S.C. § 119, this application claims priority to German Patent Application 10 2013 225 936.0, filed on Dec. 13, 2013, whose disclosure content is hereby incorporated by reference in its entirety.

TECHNICAL FIELD

The present invention relates to an apparatus and a method for correlating images of a photolithographic mask.

BACKGROUND

As a result of the growing integration density in the semiconductor industry (Moore's law), photolithographic masks have to project increasingly smaller structures onto wafers. This trend towards growing integration densities is accounted for, among other things, by shifting the exposure wavelength of the lithography devices to smaller and smaller wavelengths. Presently, in lithography devices an ArF (argon fluoride) excimer laser is often used as a light source, emitting at a wavelength of approximately 193 nm.

At present, lithography systems are being developed which use electromagnetic radiation in the EUV (extreme ultraviolet) wavelength range (in the range of 10 nm to 15 nm). These EUV lithography systems are based on a completely new beamline concept, which preferably uses reflective optical elements including reflective photomasks.

Due to the small wavelength in the EUV range, photomasks have to fulfill extreme requirements with regard to the precision of predetermined surfaces. Deviations in the surface topology in the multilayer mirror systems of photolithographic EUV masks in the single-digit nanometer range already lead to a significant variation of the reflected intensity within the EUV beam. Due to the technological challenges for the manufacture of present day and in particular future photolithographic masks and the high costs implied by this, photomasks not fulfilling a predetermined specification are repaired whenever possible.

Typical photomasks can comprise many large regions with uniform, periodically repeating patterns. FIG. 1 schematically shows as a typical example a section of a photomask 100 with a periodic arrangement of absorbing tracks 110 as structural elements which are arranged on the substrate 120 of the mask 100 ("lines and spaces"). A unique correlation of two images of a section of a photomask with periodic patterns is difficult. Within the context of this application, the terms photolithographic mask, photomask and mask are used synonymously.

Certain defects on a photomask, in particular on EUV-masks, are not visible in an image of a scanning electron microscope, because they generate not enough topology contrast. In the image of an atomic force microscope, on the other hand, these defects show up, for example, as bulges or indentations having a height or depth in the single-digit nanometer range. Such defects may, for example, be repaired by an electron beam repair tool, for example the MeRiT® tool of the applicant. For this, it is necessary, however, to superimpose the images of the atomic force microscope (AFM) and the scanning electron microscope (SEM) with an accuracy in the single-digit nanometer range, in order to repair at the appropriate location. Due to the issue described above, this faces serious difficulties.

An AFM as well as a SEM may both be calibrated with marks that are present on every photomask in a marginal region and between the dies, such that these devices work with absolute mask coordinates. However, the individual markers are spaced apart from one another on the mask by such a distance that, in general, they are not shown in an image or image section generated by a SEM or AFM. The accuracy of the superposition of two images or image sections having been recorded with an AFM and a SEM is then limited by the calibration and the accuracy of the movements of the microscope stage of the repair tool. The achievable accuracy is in general not sufficient in order to be able to reliably repair the defects described above with a SEM. With the help of the calibration by markers on the mask it may, however, be assured that the images or image sections of the mask at least partially overlap.

For the precision alignment of the two images, three methods exist at present: first, markers may be positioned "blindly" around the assumed defect location with a repair tool. These markers are then clearly visible in an image subsequently recorded with an AFM. For the repair, the two images having been generated from an AFM-scan and an SEM-scan can then be precisely superimposed. This method has the disadvantage that markers can potentially be positioned at the wrong locations and by this the photomask may be processed in a wrong location. Furthermore, the additional marking step costs further time.

Second, the WO 2013/010976 A2 describes a method for localizing the above described defects on the substrate of a photolithographic mask and for applying a marker in the vicinity of the defect, which uses three different measurement devices. Hence, the disclosed method is on the one hand labor-intensive and on the other hand it may be necessary to remove the applied marker(s) again at the end of the repair process in an additional process step.

Finally, a previous scan of a defect location with an SEM may leave behind what is called a "scanbox", which is then visible in a subsequent scan of the defect location with an AFM in the corresponding image. A scanbox is created when an electron beam essentially carbonizes organic molecules absorbed on an imaged surface and therefore deposits a permanent product containing carbon. This method has the disadvantage that scanboxes are unwanted. In addition, they are only created if the SEM is contaminated with volatile organic compounds.

SUMMARY

The present invention is therefore based on the problem of providing an apparatus and method for correlating two or more images of a photolithographic mask which at least partially avoid the above mentioned disadvantages and limitations.

According to an embodiment of the present invention, this problem is solved by an apparatus for correlating at least two images of a photolithographic mask. In an embodiment, the apparatus for correlating at least two images of a photolithographic mask which at least partially overlap comprises a correlation unit that is provided to use at least one random variation, which is present in the at least two images, of at least one structural element of the photolithographic mask for the correlation of the at least two images.

The inventive apparatus makes use of markers which are always present on a photomask in the form of random variations of structural elements. Therefore, the invention has the advantage that no markers for superimposing two or more images of a section of a photomask have to be applied. The related processing step may therefore be omitted. Furthermore, it is also not necessary to remove the applied markers again from the photomask in a further processing step after conclusion of a processing process of the photolithographic mask.

In an aspect, at least one image of the at least two images is recorded by a particle microscope. According to a further aspect, the particle microscope uses electrons and/or ions and/or photons for the imaging of the photolithographic mask.

At the present time, the particle microscope preferably operates on the basis of a rastering- or scanning principle; at the present time these devices provide the necessary resolution.

The term "essentially" designates, here as well as at other locations within the description, an experimental determination of a respective physical quantity within the usual measurement errors.

In another aspect, at least one image of the at least two images is recorded by a scanning probe microscope. According to a further aspect, the scanning probe microscope comprises an atomic force microscope and/or a scanning tunneling microscope and/or a magnetic force microscope and/or a near-field scanning optical microscope and/or a near-field scanning acoustic microscope and/or a scanning capacitance microscope.

According to a preferred aspect, the correlation unit is provided to correlate at least two images that have been recorded temporally shifted by the same particle microscope or scanning probe microscope.

An image of a section of a photomask once recorded by a particle microscope or a scanning probe microscope can be stored in order to determine, after periodic or non-periodic time intervals, whether the imaged section of the photomask or the measurement device have shifted with regard to one another over time. This might, e.g., be due to a thermal drift. With the help of images of the same section of the photomask that are recorded temporally shifted and that are recorded with the same measurement device, a slow change in the relative position between the measurement device and the photomask can be determined and subsequently corrected for.

The first and the second image must not depict completely different sections of a photolithographic mask. It is, however, not necessary that the two or more images depict the same section of a photomask. For employing the described apparatus it is sufficient that the images comprise a partial overlap. It is furthermore not necessary that the two or more images comprise the same scaling. Furthermore, the images which shall be correlated may be rotated or distorted with respect to each other.

Preferably, the at least partial overlap of the at least two images comprises at least an overlap region of ≥20%, preferably ≥40%, more preferred ≥60%, and most preferred ≥80% of the area of the smallest image.

In a particularly preferred aspect, the at least one random variation of the at least one structural element comprises a random deviation of at least one periodic structural element. According to a further beneficial aspect, the at least one random variation comprises a surface roughness of the at least one structural element. According to yet another preferred aspect, the surface roughness comprises an edge roughness of the at least one structural element. In yet another beneficial aspect, the at least one random variation comprises a granular structure of the at least one structural element.

Random variations of structural elements applied to a photomask preferably form a unique "fingerprint" of a section of a photomask depicted in an image. The defined apparatus uses the random variations as markers present on a photomask in order to align measurement devices such that the two or more images of the section of a photomask generated by these measurement devices partially overlap. A requirement for employing the above defined apparatus is that the images, which shall be correlated, comprise a sufficient resolution and low noise in order for the "fingerprint" of the section of the photomask to be clearly visible in the images that shall be correlated to one another. Particle microscopes and scanning probe microscopes available at the present time can easily fulfil these requirements.

Preferably, the correlation unit is provided to determine at least one characteristic point in each of the at least two images from the edge roughness of the at least one structural element for use in the correlating of the at least two images. In another aspect, the correlation unit is provided to determine at least one characteristic point in each of the at least two images from the granular structure and/or the edge roughness of the at least one structural element for use in the correlating of the at least two images.

According to a further aspect, the at least one characteristic point comprises an apex of random indentations and/or random bulges of the at least one structural element of the photolithographic mask. Preferably, the correlation unit is further provided to determine the at least one characteristic point from a comparison of at least one predetermined structural element of the photolithographic mask with at least an image of the at least one predetermined structural element of the photolithographic mask.

According to a further preferred aspect, the correlation unit is provided to determine a transformation which transforms the at least two images into each other. Preferably, the correlation unit is provided to perform the transformation by equivalent image coordinate points.

In this context, a transformation can not only comprises a translation of the two images relative to one another. Rather, the transformation can also comprise a rotation and a scaling of a first image with respect to a second image.

According to yet another beneficial aspect, the correlation unit is provided to determine the transformation in a two-stage process: in a first step by using the at least one random variation of the at least one structural element, and in a second step on a pixel-by-pixel basis.

Preferably, the aligning of two or more images with respect to one another is a three-stage process. In the first stage—as explained in the introductory part—the markers present on a photomask are used such that a particle microscope and/or a scanning probe microscope can work in absolute mask-coordinates. In this way, a section of the photomask is determined which shall be recorded by the particle microscope and hence also the section is determined which shall be scanned by the scanning probe microscope. While the images of the two measurement devices need not comprise any markers, it is assured by working in absolute mask-coordinates that the images generated by these measurement devices at least partially overlap. In the second stage, the two (or more) images are aligned to one another with the help of random variations of the structural elements of the photomask. Finally, in a third step, the transformation for an optimal congruence of the two images can be determined by a pixel-by-pixel computation. The defined apparatus therefore simultaneously combines a high precision in the alignment with a fast determination of the transformation that is aligning the images to one another.

According to yet another aspect, the correlation unit is provided to determine a quality factor of the performed correlation. The quality factor states whether the alignment of the images was successful. For this to be true, the quality factor has to surpass a predetermined threshold value. In this way, a damaging of the photomask through processing at a wrong location in the case of an incorrect superposition of the images is avoided.

Preferably, the correlation unit is provided to generate from at least a first of the at least two images a simulation of a second of the at least two images, wherein the simulated image is used for the correlation of the first and the second image.

According to yet another aspect, the correlation unit is provided to determine, from at least one image having been recorded by the scanning probe microscope, at least one simulated image of the particle microscope. According to yet another aspect of the invention, the correlation unit is provided for correlating at least one simulated image of the particle microscope and at least one image recorded by the particle microscope.

Alternatively or in addition, the correlation unit is provided to determine, from at least one image having been recorded by the particle microscope, at least one simulated image of the scanning probe microscope. According to a further aspect of the invention, the correlation unit is provided for correlating at least one simulated image of the scanning probe microscope and at least one image recorded with the scanning probe microscope.

Preferably, the apparatus further comprises: means for correcting at least one defect of the photolithographic mask that is present in at least one of the at least two images.

A particular advantage of the defined apparatus is that it can be used for the correction of a defect of a photomask, despite the fact that the defect may potentially not be made visible with the microscope type that is used for the repair.

In an embodiment, a method for correlating at least two images of a photolithographic mask that at least partially overlap comprises the step of: correlating the at least two images using at least one random variation, which is present in the at least two images, of at least one structural element of the photolithographic mask.

According to a further aspect, the method makes use of an apparatus according to one of the aspects described above.

Furthermore, another preferred aspect of the method comprises the step of: correcting at least one defect of the photolithographic mask that is present in at least one of the at least two images.

Finally, the present invention relates to a computer program whose instructions carry out the steps of a method according to the above mentioned aspects when the computer program is executed by a computer.

BRIEF DESCRIPTION OF DRAWINGS

In the following detailed description, presently preferred embodiments of the invention are described with reference to the following figures, wherein FIG. 1 schematically shows a top view of a section of an ideal photolithographic mask with a periodic sequence of absorbing and reflecting or absorbing and transmitting line-shaped regions.

DETAILED DESCRIPTION

In the following, preferred embodiments of an apparatus for correlating at least two images of a photolithographic mask as well as of the inventive method are explained. They are discussed in an exemplary manner using the superposition of photomasks. Inventive apparatuses and methods are, however, not restricted to the ultraviolet or extreme ultraviolet wavelength range of the electromagnetic spectrum.

Figure 1:
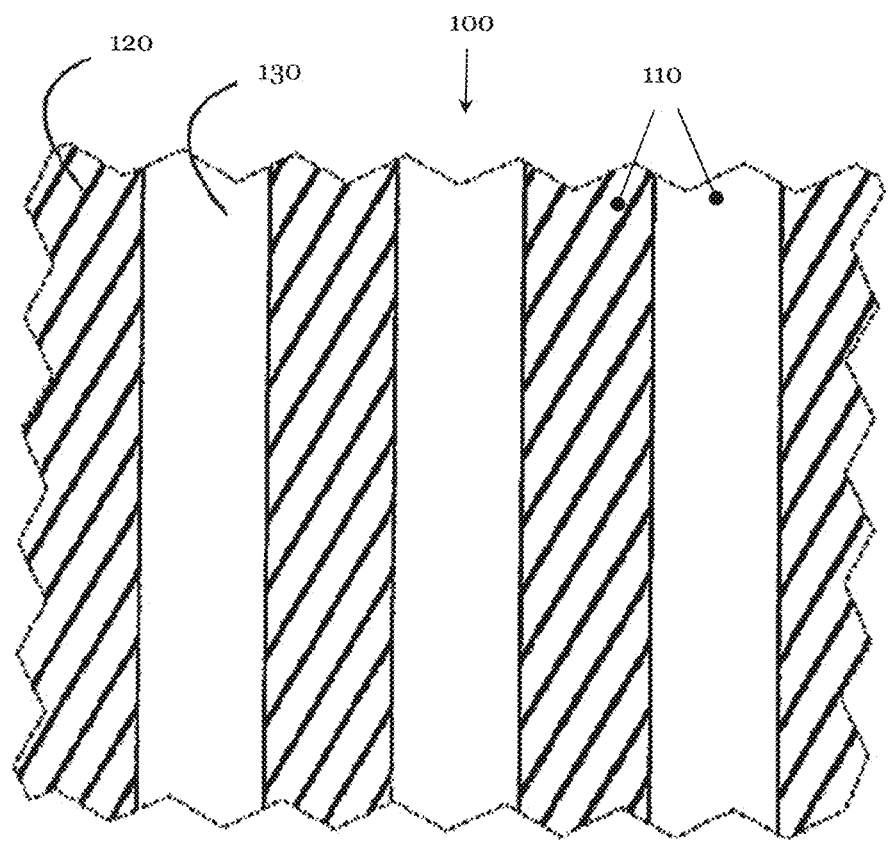

FIG. 1 shows a top view of a section 100 of an ideal photolithographic mask 110. The section 100 illustrates in an exemplary manner a periodic sequence of absorbing line-shaped structural elements 120, which are arranged on the substrate 130 of the photomask 110 (lines and spaces). The "lines and spaces" structure of the section 100 of the photomask 110 is symmetric under translations in two dimensions. If the substrate 130 is transparent, the section 100 illustrates a transmitting photomask 110.

Figure 2:
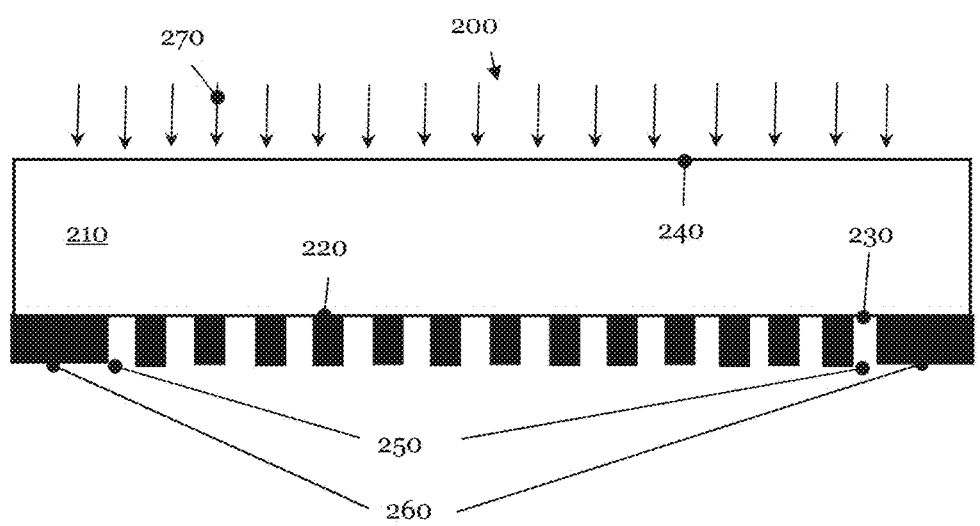
FIG. 2 schematically shows a cross-sectional view of a transmitting photomask with absorbing structural elements.

FIG. 2 schematically represents a cross-sectional view of a transmitting photolithographic mask 200. The photomask or mask 200 comprises a substrate 210, which comprises a first or front surface 230 and a second or back surface 240. The substrate 210 has to be essentially transparent for the wavelength which is used for exposing the photoresist on the wafer. The exposure wavelength may lie in the deep ultraviolet (DUV) spectral range of the electromagnetic spectrum, in particular in the region of 193 nm. The substrate material usually comprises quartz. The substrate typically comprises lateral dimensions of 152 mm×152 mm and a thickness or height of essentially 6.35 mm. The substrate 210 of the mask 200 has structural elements 220 on its front side 230 which are typically manufactured from chromium or from compounds of the elements tantalum (Ta), molybdenum (Mo), silicon (Si) and oxygen (O).

The structural elements 220 are projected onto the photoresist in such a manner that they create the predetermined structures or patterns from which the semiconductor elements are produced. The part of the substrate 210 of the photolithographic mask 200 that carries the structural elements 220 is called the active area 250 of the mask 200, whereas the marginal part that comprises no structural elements 220 is called the non-active area 260. A laser beam 270 illuminates the substrate 210 of the mask 200 at the exposure wavelength from the second or back surface 240 of the substrate 210.

Figure 3:
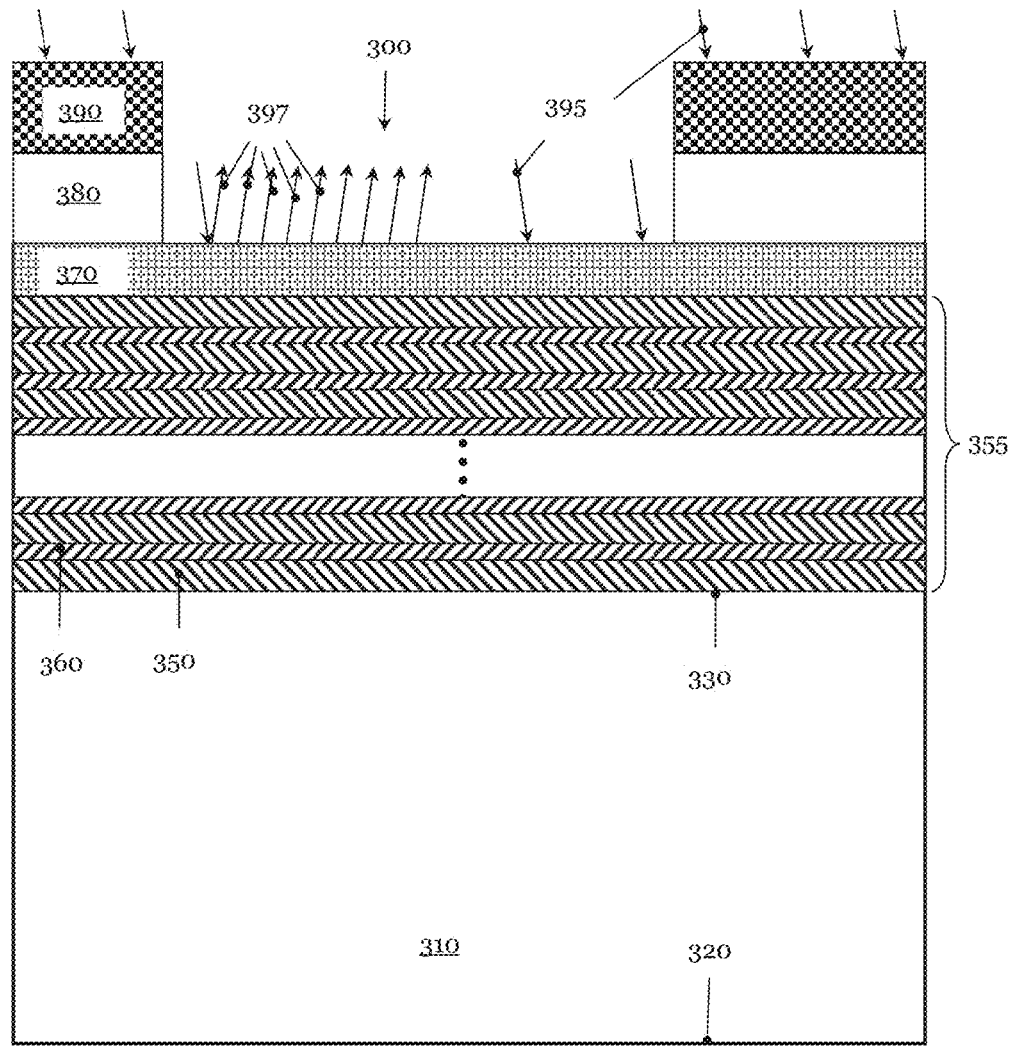
FIG. 3 illustrates a schematic cross-sectional view of a reflective photomask with absorbing structural elements.

If the substrate 130 of the photomask 110 of FIG. 1 is not transparent but reflects incident radiation, then the section 100 of FIG. 1 represents a reflective photomasks 110. FIG. 3 shows a schematic cross-sectional view of a reflective photolithographic mask 300 for future use in the extreme ultraviolet (EUV) spectral range of the electromagnetic spectrum, in particular for an exposure wavelength of approximately 13.5 nm. In contrast to the photomask 200 of FIG. 2, the mask 300 is a reflective optical element on the basis of a multilayer mirror structure 355. The multilayer mirror structure 355 of the mask 300 is deposited on a front substrate surface 330 of a suitable substrate 310 such as, for example, a quartz glass substrate. Different transparent dielectrics, glass materials, or semiconducting materials may also be used as substrates for EUV masks, such as ZERODUR®, ULE® or CLEAR-CERAM®.

The multilayer mirror system 355 comprises approximately 40 pairs of alternating molybdenum (Mo) 350 and silicon (Si) layers 360. For example, the thickness of each Mo-layer 350 amounts to 4.15 nm and the Si-layer 360 is 2.80 nm thick. In order to protect the multilayer structure 355, a covering layer 370 from silicon, ruthenium, or titanium oxide ($TiO_2$) is arranged on the structure. In the multilayer mirror structure 355, the Mo-layers act as scattering layers, whereas the silicon layers 360 act as separation layers. For the scattering layers, other elements with a high atomic number such as, for example, cobalt (Co), nickel (Ni), tungsten (W), rhenium (Rh), or iridium (Ir) may be used instead of Mo. At least the larger part of the EUV photons 395 incident on the multilayer structure 355 is reflected by the multilayer structure 355 as reflected radiation 397.

On the covering layer 370, the EUV mask 300 comprises a buffer structure 380. Possible materials for the buffer layer 380 are, for example, quartz ($SiO_2$), ruthenium (Ru), chromium (Cr) and/or chromium nitride (CrN). The absorbing structural elements 390 comprise a material that comprises a large absorption constant for photons in the EUV range. Examples of such materials are Cr, titanium nitride (TiN), and/or tantalum nitride (TaN). A thickness in the region of approximately 15 nm is already sufficient in order to absorb essentially all EUV photons 395 incident on the structural elements 390. In addition, an anti-reflection layer (AR-layer) may be arranged on the absorbing structural elements 390 (not shown in FIG. 3) which assures that no photons 395 are reflected by the structural elements 390. A material for an AR-layer is, for example, tantalumoxynitride (TaON).

Figure 4:
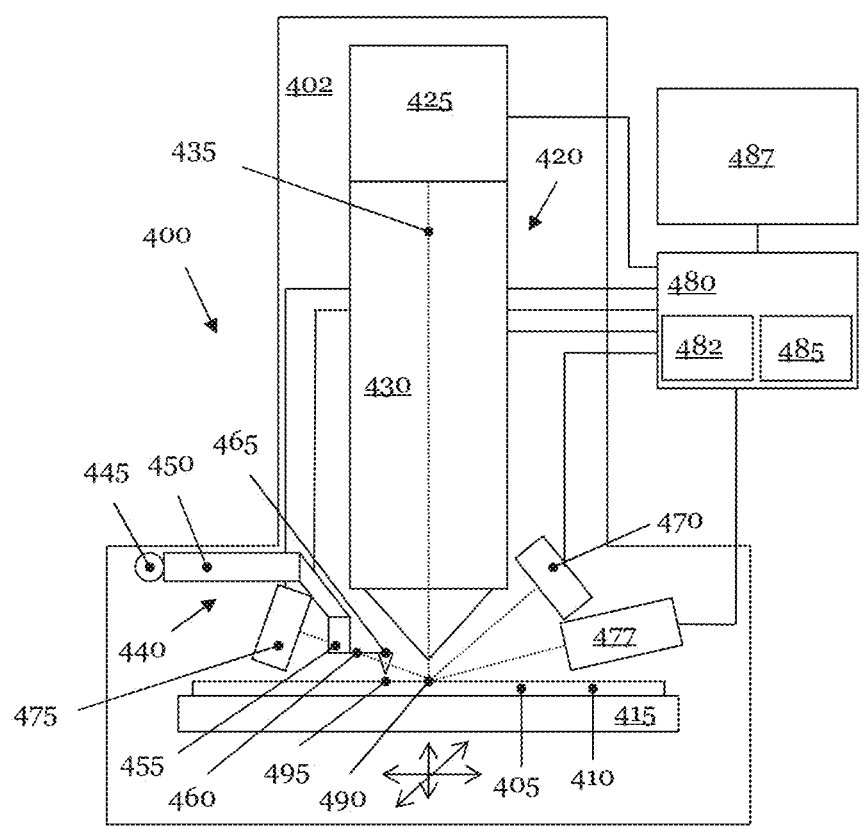
FIG. 4 represents a schematic view of some components of an apparatus comprising a scanning electron microscope, an atomic force microscope and a correlation unit.

FIG. 4 schematically shows some components of a microscope system 400 which comprises a scanning particle microscope 420 and a scanning probe microscope 440 which are arranged next to each other in a vacuum chamber 402. The scanning particle microscope 420 comprises a particle cannon 425 and a column 430. The particle cannon 425 creates a particle beam 435 and the column 430 focuses the particle beam 435 and directs it onto a sample 405, for example onto a section of the photomask 200, 300.

The sample 405 is arranged on a sample stage 415. As symbolized in FIG. 4 by arrows, the sample stage 415 may be moved in three spatial dimensions relative to the scanning particle microscope 420 and the scanning probe microscope 440. In an alternative embodiment, the sample stage 415 may not be movable and the scanning particle microscope 420 and the scanning probe microscope 440 are jointly moved relative to the sample stage 415. It is further possible to arbitrarily distribute the relative movement between the analyzing devices 420 and 440 and the sample stage 415. As an example, the sample stage 415 may be movable in a plane perpendicular to the particle beam 435 and the scanning particle microscope 420 and the scanning probe microscope 440 may be movable in the beam direction. The movement may be performed with one or more micro translation elements (not shown in FIG. 4). It is furthermore possible to provide the sample stage 415 as well as the analyzing devices 420 and 440 with three-dimensional movement capabilities.

The particle beam 435 hits the sample 405 at the first measurement point 490. The sample 405 may be any arbitrary micro-structured component or part. Hence, the sample 405 may, for example, comprise a transmitting (cf. FIG. 2) or a reflective photomask (cf. FIG. 3).

In the embodiment of the microscope system 400 illustrated in FIG. 4, the scanning particle microscope 420 comprises a scanning electron microscope (SEM). Using an electron beam as particle beam 435 has the advantage that the beam can essentially not damage the sample 405, for example the mask 200, 300. Due to the small working distance between the electron cannon 430 and the sample 405 shown in FIG. 4, the electron beam 435 can be focused at the first measurement point 490 to a spot with a diameter of less than 10 nm, preferably less than 3 nm and most preferred less than 1 nm.

Instead of a scanning electron microscope, the microscope system 400 may use a scanning transmission electron microscope (STEM) as scanning particle microscope 420 for a transmitting photomask 200. Moreover, the scanning particle microscope 420 may also use an ion beam instead of electrons, i.e., in this case the scanning particle microscope 420 comprises an FIB (focused ion beam) device. Furthermore, the scanning particle microscope 420 can use short wavelength photons for the inspection of a photomask 200, 300. The wavelength of the photons being used has to be so small that the image created by the photons can resolve structures in the nanometer range. For the creation of photons in this wavelength range, for example, a synchrotron may be used.

The scanning probe microscope 440 is, in the example shown in FIG. 4, an atomic force microscope (AFM). Instead of an AFM, a scanning tunneling microscope may also be used. Besides the tunneling current (scanning tunneling microscope) and the van-der-Waals-forces (force microscope), many further physical quantities may be used for inspecting a sample 405 such as, for example, the photomask 200, 300. A magnetic force microscope, for example, makes use of the magnetic interaction between the sample 405 and the probe or its tip. A scanning acoustic microscope uses phonons and a near-field scanning optical microscope uses photons for inspection of the sample 405. This enumeration of different types of scanning probe microscopes is only exemplary and in no way complete.

In the exemplary microscope system 400 shown in FIG. 4, the AFM 440 is attached to the mounting of the electron cannon 430 with the help of a swivel 445 (not fully shown in FIG. 4). The swivel 445 brings the AFM 440 from a parking position (not shown in FIG. 4) into a working position. Furthermore, the swivel 445 may bring the AFM 440 into a position for changing the probe.

A mounting 450 guides the measurement head of the AFM 440 into the vicinity of the first measurement point 490, at which the electron beam 435 hits the photomask 200, 300. The mounting 450 may further comprise one or more translation elements (not shown in FIG. 4) in order to adjust the position of the AFM 440 to the sample 405 to be inspected.

The upper end of the piezo-actuator 455 of the AFM 440 is connected with the mounting 450. The other end of the piezo-actuator 455 carries the probe of the AFM 440. It comprises a leverage arm 460, which will be called a cantilever 460 in the following description, as is common in the field. The cantilever 460 carries at its free end a measurement tip 465. The measurement tip 465 enters into interaction with the sample 405 or the photomask 200, 300 at the second measurement point 495.

The computer system 480 can output a signal to the piezo-actuator 460 such that it scans over the photomask 200, 300 in order to determine a two- or three-dimensional contour of the surface of a section of the photomask 200, 300.

A detector 470 transforms the secondary electrons created by the electron beam 435 at the first measurement point 490 and/or electrons backscattered by the sample 405 into an electrical measurement signal and forwards it to the computer system 480. The detector 470 may include a filter or a filter system in order to discriminate the electrons in their energy and/or spatial angle (not shown in FIG. 4).

The microscope system 400 may further comprise a detector 475 for the detection of photons created by the incident electron beam 435 at the first measurement point 490. The detector 475 may, for example, spectrally resolve the energy spectrum of the created photons and allow drawing inferences on the composition of the surface or layers close to the surface of the photomask 200, 300. The spatial separation of the working region of the SEM 420 (first measurement point 490) and the working region of the AFM 440 (second measurement point 495) provides room for the installation of the second detector 475. By a combination of the information contained in the detected electrons and photons, a more thorough picture of the photomask 200, 300 or its material composition is provided in comparison to the measurement signal of only one detector 470 or 475.

In order to get to the second measurement point 495 of the scanning probe microscope 440 from the first measurement point 490 of the scanning particle microscope 420, the sample stage 415 translates the mask 200, 300 by the distance between both points 490 and 495, as indicated by the arrows in FIG. 4. In an alternative embodiment, the sample stage 415 may be fixed in space and the scanning particle microscope 420 and the scanning probe microscope 440 are moved by the distance between the two measurement points 490 and 495. A combined movement of the sample stage 415 and the two scanning microscopes 420 and 440 is also conceivable.

In addition to this, the exemplary microscope system 400 comprises an ion source 477, which provides low energetic ions in the region of the first measurement point 490 to potentially avoid an electric charging of the surface of the photomask 200, 300 by the electron beam 435 and hence a reduction of the spatial resolution of the incident electron beam 435.

For future photomasks for the EUV wavelength range, the resolution of the images produced by the scanning particle microscope 420 and the scanning probe microscope 440 has to be in the single-digit nanometer range or below. A scanning particle microscope 420 with a beam diameter of <10 nm can achieve this. An AFM as an example of a scanning probe microscope 440 may also resolve structures in the sub-nanometer range. The signal-to-noise ratio of the produced images should be 5 dB or larger.

The computer system 480 comprises an evaluation unit 482 which analyzes the measurement signals of the detectors 470 and 475 and creates a picture or an image from them, which is shown on the display 487. The evaluation unit 482 also processes the measurement signal of the AFM 440 and provides a graphic representation thereof on the display 487. The computer system 480 can control the electron cannon 425 and the column 430 of the SEM 420. The computer system 480 can also control the AFM 440. By applying electrical signals to the connections of the piezo-actuator 460, the computer system 480 can also scan it in x- and/or y-direction across the photomask 200, 300.

The computer system 480 can be a microprocessor, a CPU, a PC and/or a workstation. It can be integrated into the microscope system 400 or it can be a separate device. The computer system 480 can also include an input- and/or output device such as, for example, a keyboard, a mouse, and/or a printer. The computer system 480 may be provided as hardware, software, firmware, or a combination thereof.

Furthermore, the computer system 480 comprises a correlation unit 485. The correlation unit 485 is able to align relative to each other image data that have been captured by the scanning particle microscope 420 and/or the scanning probe microscope 440. To this end, the correlation unit 485 comprises algorithms to relate to one another the image data generated from the measurement signals of the AFM 440 in the detectors 470 and/or 475. In a currently preferred embodiment, the correlation unit 485 computes a simulated image of the scanning particle microscope 420 from the image data of the AFM 440. The correlation unit 485 then compares the simulated image of the scanning particle microscope 420 with image data originating from the scanning particle microscope 420. In this way, the different imaging characteristics of the measurement methods of the scanning particle microscope 420 and the scanning probe microscope 440 are accounted for.

In a preferred embodiment, the algorithms of the correlation unit 485 yield a quality factor that states how successful the superposition of two or more images of a section of a photomask 200, 300 has been. The algorithms employed by the correlation unit 485 are similar to those that can be employed for comparing fingerprints or for facial recognition. Details regarding the correlation process performed by the correlation unit 485 are described in the context of the discussion of the following FIGS. 5 to 9.

The correlation unit 485 can be provided as hardware, software, firmware, or a combination from hardware, software and/or firmware. The correlation unit 485 can be integrated into the computer system 480 or it can be provided as a separate unit within the microscope system 400. It is furthermore also possible to provide the correlation unit 485 as a completely separate unit (not shown in FIG. 4) which wirelessly or via wire obtains image data of the scanning particle microscope 420 and/or the scanning probe microscope 440 from the evaluation unit 482 of the computer system 480, performs a correlation of these image data and then displays the results on a monitor or transfers the correlation results back to the computer system 480 for being displayed by the display 487.

Furthermore, the microscope system 400 comprises one or more pumping systems (not shown in FIG. 4), in order to create and to maintain a vacuum within the vacuum chamber 402.

In order for the microscope system 400 shown in FIG. 4 to be able to repair one or more defects of the photomask 110 and hence become a repair tool, it is necessary that the microscope system 400 can provide one or more processing gases. For this it is necessary that the microscope system 400 can provide one or more gas containers together with respective valves and gas feeding systems (also not shown in FIG. 4). Such a repair tool is described by applicant in the PCT application WO 2012/146647 A2, reference to which is herewith made. A repair tool may locally induce chemical reactions under the influence of the electron beam 435 and one or more processing gases, with which the photomask 200, 300 can selectively locally be changed by material removal or material deposition.

Figure 5:
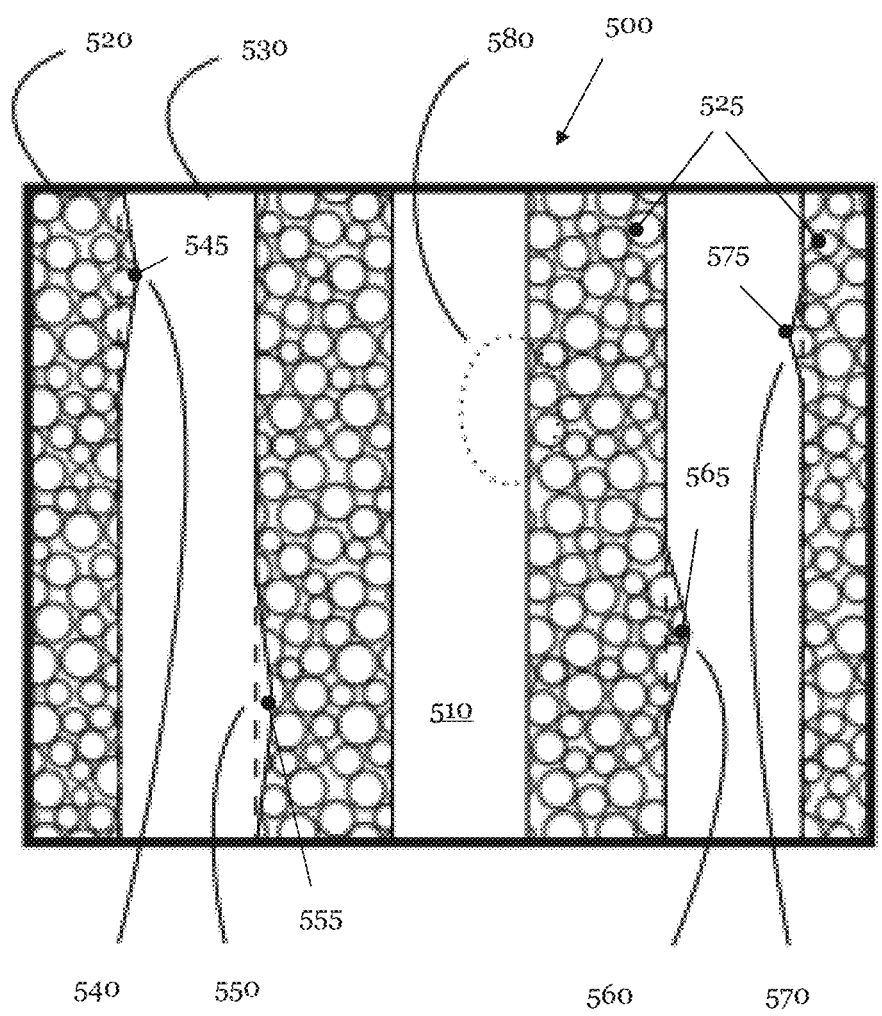
FIG. 5 schematically depicts a first image of an actual section of a mask with absorbing and reflecting or transparent line-shaped regions.

In the following, details of the correlation process performed by the correlation unit 485 will be described with the help of FIGS. 5 to 9. FIG. 5 shows a section 500 of an actual photomask 510. The photomask 510 can be a transmitting 200 (cf. FIG. 2) or a reflective photolithographic mask 300 (cf. FIG. 3). In the following, for the sake of simplicity, it is assumed that the mask 510 as well as the further described masks are transmitting photomasks 200, i.e., the substrate 530 of the mask 510 is transparent for the photons of the actinic radiation.

Similar to the section 100 of the ideal photomask 110 of FIG. 1, FIG. 5 presents a section 500 of the photomask 510 which comprises structural elements 520 in a periodic "lines and spaces" arrangement. The section 500 of the photomask 510 was recorded with a scanning electron microscope 420, for example the SEM of the microscope system 400 of FIG. 4, with a high resolution. In this way, the granular structure 525 of the material of the structural elements 520 shows up.

FIG. 5 further shows that the edges of the structural elements 520 of the actual photomask 500—different to what is envisaged in the design of the ideal photomask 110 shown in FIG. 1—are not ideal straight lines. Rather, the absorbing structural elements 520 comprise random deviations from their ideal shape. In the example of FIG. 5, these are the indentations 550 as well as the bulges 540, 560 and 570. The random variations 540, 550, 560 and 570 of the section 500 of the photomask form a unique fingerprint of the section 500 of the photomask 510. For the random variations 540, 550, 560 and 570 of the section 500 of the photomask 510, characteristic points 545, 555, 565 and 575 may be determined. As characteristic points 545, 555, 565 and 575, e.g., the apexes of the indentations and bulges 540, 550, 560 and 570 can be chosen. It is, however, also possible to choose characteristic points from the random indentations and bulges 540, 550, 560 and 570 according to a different method. For example, a certain percentage of the maximal deviation of the indentation 550 and the bulges 540, 560 and 570 from the unperturbed location of the edge can be defined as characteristic points.

The width of the structural elements 520 depends on the type of mask 510 used. For EUV masks, the width of the structural elements 520 as well as the stripes free from absorber material located in-between lies in the region of 60 nm. The variation of the edges of the structural elements 520 allowed by the current specification is less than 3 nm.

In a preferred embodiment, the characteristic points 545, 555, 565 and 575 of a section 500 of the photomask 510 are determined based on the design of a mask, as illustrated in the ideal photomask 110 of FIG. 1.

The characteristic points 545, 555, 565 and 575 are used in the following as already present markers of the section 500 of the photomask 510 in order to superimpose the section 500 of the photomask 510 with other sections or images of the photomask 510.

In the section 500 of the photomask 510, a defect 580 is present which is indicated in FIG. 5 by a dotted line. This defect 580 is, for example, a local protrusion or a local indentation of the substrate 530 of the photomask 510. The topology contrast of the defect 580 is, however, not sufficient to stand out or be visible in the image of the SEM 420 of the section 500 of the photomask 510.

Figure 6:
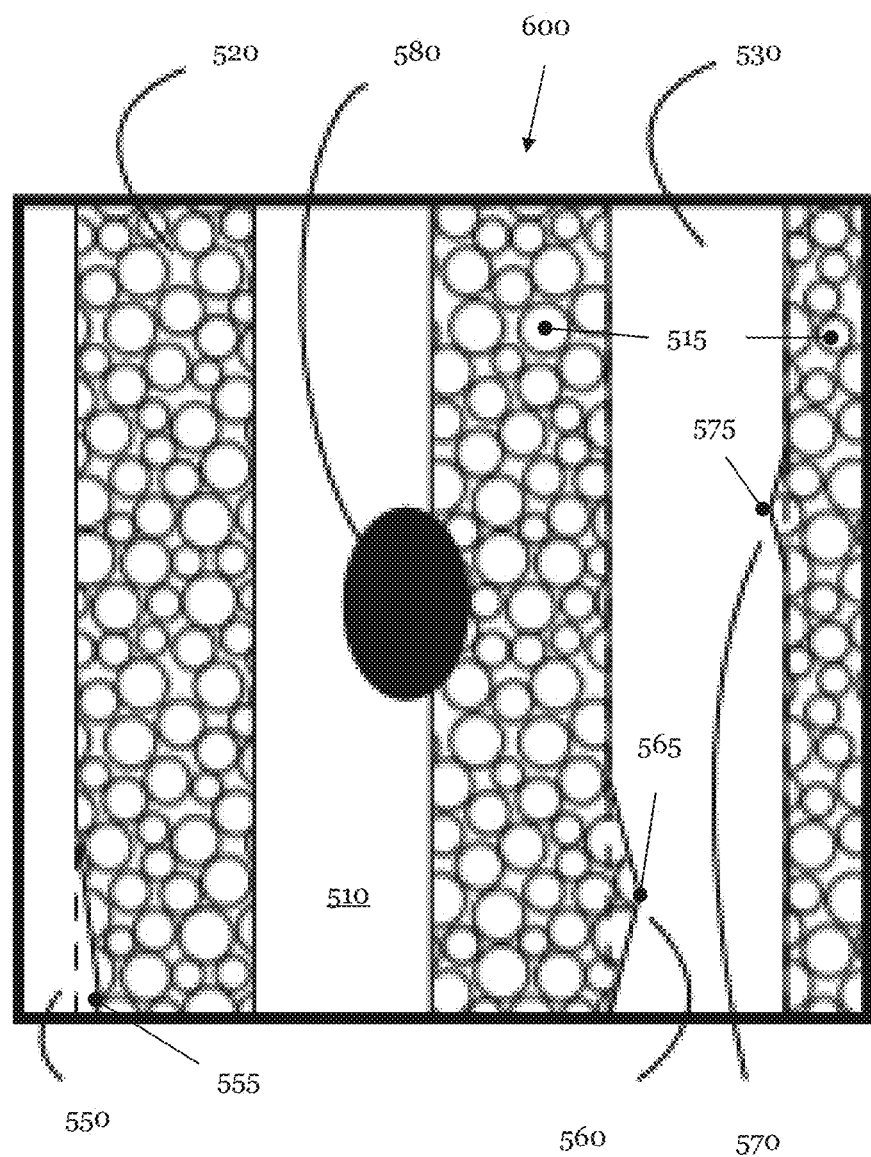
FIG. 6 schematically shows a second image of the actual section of the mask of FIG. 5.

FIG. 6 shows a section 600 of the photomask 510 which was recorded with the scanning probe microscope 440 of FIG. 4, i.e., with an AFM. Section 600 overlaps to more than 50% with the section 500 of FIG. 5. The resolution of the AFM 440 was a little bit higher than the resolution of the SEM 420, such that the section 600 depicts a smaller part of the photomask 510 than the section 500 of FIG. 5. In this example, section 600 contains the indentation 550 and two bulges 560 and 570 of the structural elements 520. From the random variations 550, 560 and 570 of the edges of the structural elements 520, the characteristic points 555, 565 and 575 of the section 600 of the photomask 510 are determined, as described above in the context of FIG. 5.

From a comparison of FIGS. 5 and 6 it becomes clear that it is beneficial for a section 500 or 600 to comprise more than one characteristic point 545, 555, 565 and 575 and for the characteristic points to be furthermore distributed over the whole section 500 and 600 of the photomask 510. In this manner, sections 500 and 600 of the photomask 510 that only overlap in a small part can be aligned with respect to one another. Also, in this way the alignment can be done with great precision. In order to use the correlation unit 485 it is, however, not necessary that the sections 500 and 600 comprise more than one common characteristic point 545, 555, 565 and 575.

It is also possible that the characteristic points 545, 555, 565 and 575 are used in combination with an additional marker that has been applied to the photomask 510 and that is visible in the sections 500 and 600 for their alignment. It is further conceivable to jointly use a scanbox and the characteristic points 545, 555, 565 and 575 for transforming the sections 500 and 600 in to one another.

As shown in FIG. 6, the resolution of the AFM 440 is high enough to make the granular structure 525 of the structural elements 520 visible in the image of the section 600 of the photomask 510.

As already mentioned, sections 500 and 600 of the photomask 510 have been recorded with different resolutions. For the superposition process described in the following and performed by the correlation unit 485, this is without meaning. It is only necessary that the sections 500 and 600 of the photomask 510 at least partially overlap, insofar as the sections 500 and 600 comprises at least one common characteristic point 545, 555, 565 or 575 that the correlation unit 485 can use as a marker for the correlation process. The sections 500 and 600 to be superimposed can be rotated with respect to each other and/or a section 500 or 600 can also comprise a distortion.

In contrast to the image of the scan of the SEM 420 of the section 500 of FIG. 5, the defect 580 is clearly visible in the image of the scan of the AFM 440 of the section 600 of FIG. 6. The AFM 440 can resolve the indentation and/or protrusion of the defect 580, which lies in the nanometer region.

Figure 7:
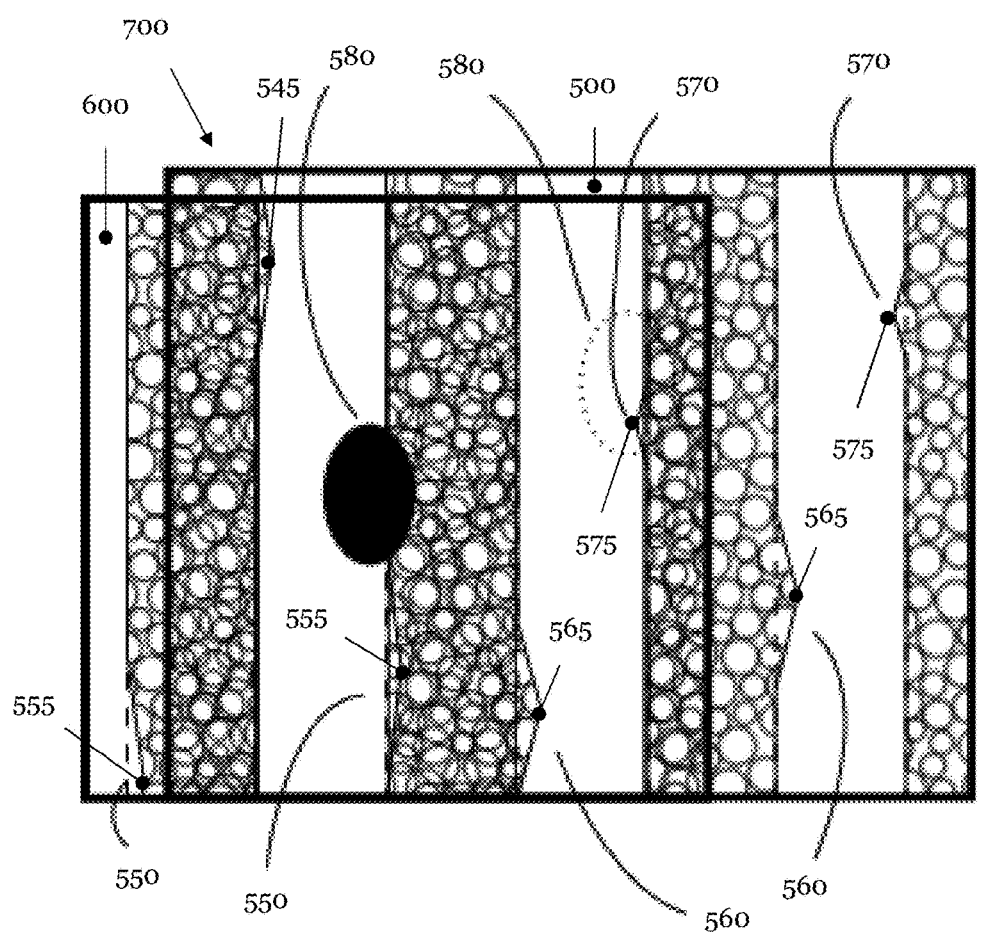
FIG. 7 schematically represents a first alignment of the images of FIG. 5 and FIG. 6.

The image 700 of FIG. 7 represents an incorrect superposition of the sections 500 and 600 of the photomask 510. The image scaling of the section 600 of the image of the AFM-scan was adapted to the resolution of the SEM-scan before superposition with the section 500. The structural elements 520 of the photomask 510 lie on top of each other, but the fingerprint of the sections 500 and 600, which manifests itself in the indentations and bulges 540, 550, 560 and 570 and the characteristic points 545, 555, 565 and 575 determined from them, does not match. Due to the translational symmetry in two dimensions of the structural elements 520 in a "lines and spaces" arrangement, the defect 580 is shown in the superposition 700 at a position shifted in the x- as well as in the y-direction. Such a superposition of the sections 500 and 600 can, for example, be the result if for the correlation of the sections 500 and 600 only the markers applied to the photomask 510 have been used.

In case the SEM 420 would be used in combination with one or more processing gases for correcting the defect 580 at the position determined from the superposition 700, the defect 580 would not be repaired. In the worst case, the substrate 520 of the photomask 510 instead of the supposed defect 580 would be damaged during the repair process, which can amount to the creation of a further defect.

Figure 8:
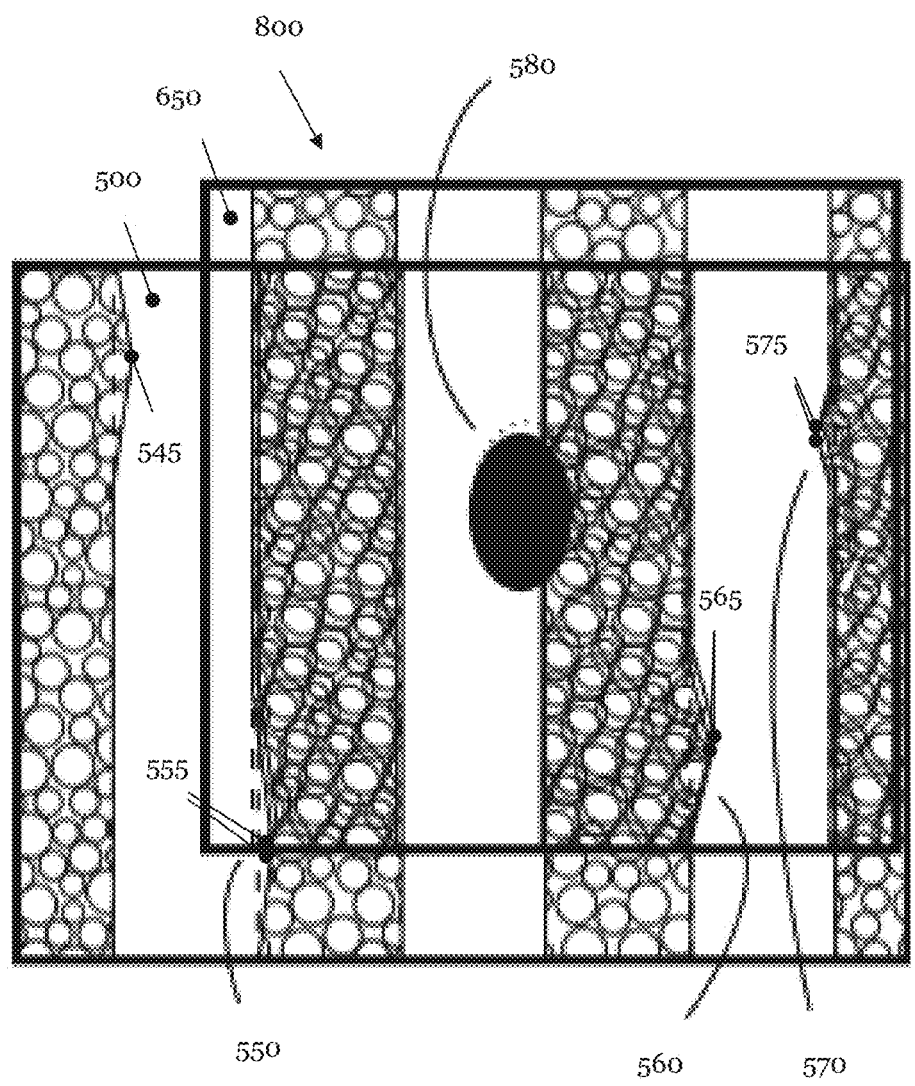
FIG. 8 schematically illustrates an alignment or superposition of the images shown in FIGS. 5 and 6 using the defined apparatus for correlating at least two images.

FIG. 8 shows a superposition 800 of the two sections 500 and 600 of FIGS. 5 and 6 whose alignment was carried out using the characteristic points 565 and 575. In the example shown in FIG. 8, a simulated SEM image 650 was computed from the image data of an AFM-scan. This computation is performed by the correlation unit 485. In this way, the different imaging characteristics of a scanning particle microscope 420 and a scanning probe microscope 440 are accounted for. When creating the simulated SEM image 650, the image scaling of the scanning probe microscope 440 is furthermore adapted to the recording of the SEM-scan. Furthermore, the simulated SEM image 650 corrects a rotation and/or a distortion of the image data of the AFM-scan.

The superposition 800 of the sections 500 and 650 displayed in FIG. 8 shows a good agreement of the positions of the characteristic points 565 and 575, i.e., an agreement in the range of some nanometers. The location of the defect 580 as it manifests itself in the simulated SEM image 650 hence also matches the actual position of the defect 580 in the section 500 of the SEM-scan well (indicated by the dotted line). The SEM 420 can therefore successfully be used for a further repair of the defect 580 despite the fact that the defect 580 is not visible in the section 500 of the SEM-scan.

In FIG. 8, the image of the SEM-scan was used as a reference and the image data of the AFM-scan were adapted to the reference through a computation of a simulated SEM image 650. It is also possible to use the image of the scanning probe microscope-scan as a reference and to adjust the image data of the scanning particle microscope-scan to this reference.

Figure 9:
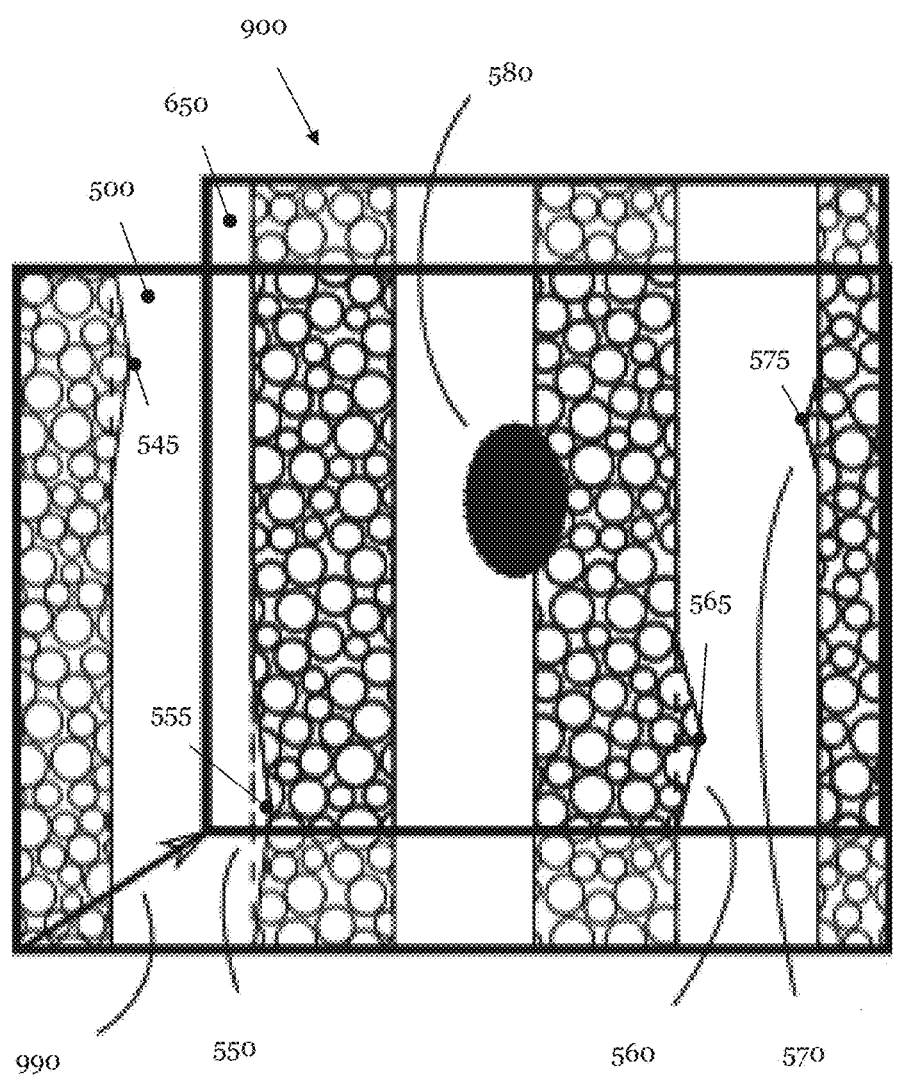
FIG. 9 schematically shows a perfect alignment of the images of FIGS. 5 and 6 after correlating the granular structure of the structural elements of a photomask shown in the images of FIGS. 5 and 6.

As can be gathered from FIG. 8, the granular structures 525 of the structural elements 520 of the simulated SEM image 650 and of the section 500 of the SEM-scan do not yet match. The agreement of the simulated SEM image 650 and the measured section 500 of the SEM can therefore still be further improved. On a pixel-by-pixel basis, the granular structures 525 of the sections 500 and 650 can be made to coincide to a large degree by the correlation unit 485. FIG. 9 represents the sections 500 and 650 after the correlating of the granular structures 525 of the two sections 500 and 650. In the context of the two-stage alignment process, the correlation unit 485 computes a transformation 990 which brings the simulated SEM image 650 essentially into congruence with the section 500 measured by the SEM 420.

The determination of the transformation 990 with the help of characteristic points 545, 555, 565, 575 only needs little computational effort and therefore allows for a fast process operation. The refining step by correlating the granular structure 525 of the structural elements 520 of the sections 500 and 650 also only requires a medium computational effort because the points that shall be superimposed already lie close to each other. Moreover—and this is the more important aspect—the two-stage approach prevents the correlation unit 485 from erroneously finding a transformation 990 to a secondary maximum. When using a standard method for correlating images with periodic structural elements, this may happen—as shown in FIG. 7 in an exemplary manner.

A repair of the defect 580 through the scanning particle microscope 420 using one or more processing gases is essentially successful after performing the transformation 990 of the simulated SEM image 650.

As already elaborated on above during the discussion of FIG. 8, in an alternative embodiment the correlation unit 485 can compute the transformation 990 merely on the basis of the characteristic points 565 and 575 without performing the correlation of the granular structure 525 of the structural elements 520 of the sections 500 and 650.

Figure 10:
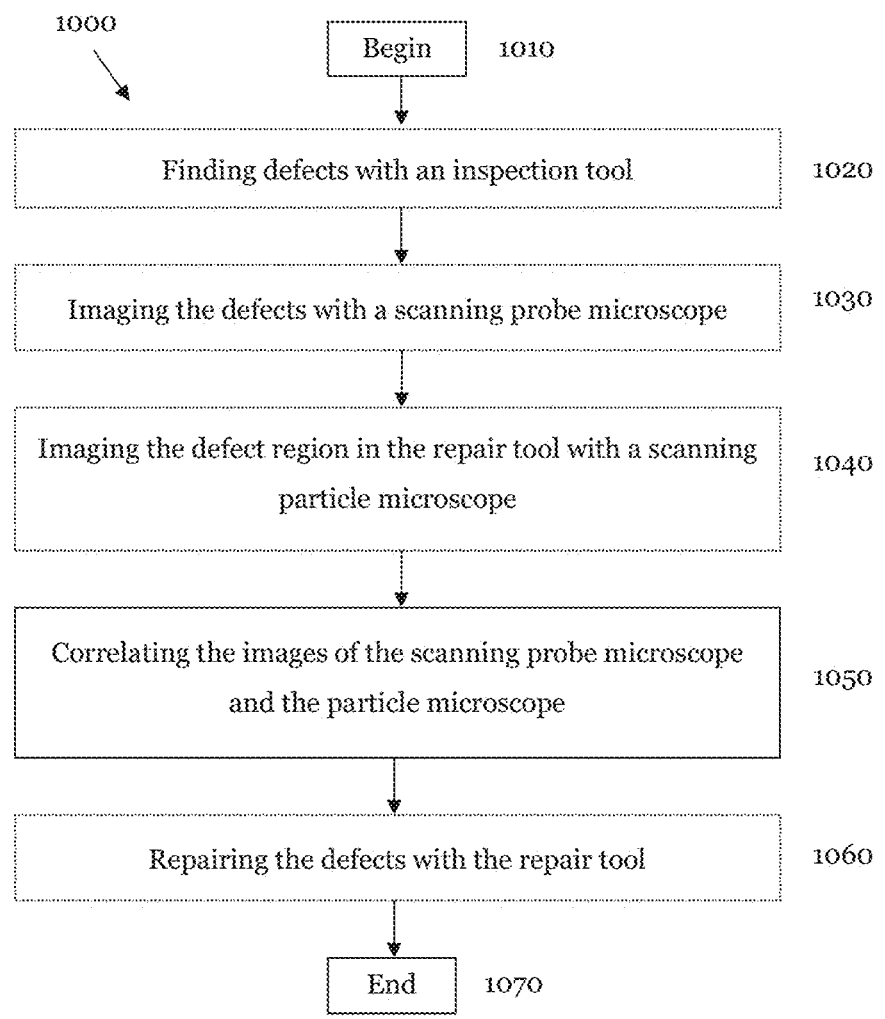
FIG. 10 depicts a flow diagram of a method for repairing a defect of a photolithographic mask.

Finally, FIG. 10 shows a flow diagram 1000 of a process for repairing a mask defect 580 and illustrates the embedding of the method for correlating two or more images within the repair process. The repair process begins at 1010. In the first step 1020, a photomask 200, 300, 510 is inspected for defects 580 being present with an inspection tool. As a repair tool, for example an AIMS™ (Aerial Image Metrology System) device may be used that is inserted into a lithography device instead of the wafer and that measures the created aerial image at this location.

In step 1030, the defect(s) 580 detected or identified in the preceding step 1020 are measured by a scanning probe microscope 440, such as for example the AFM of the microscope system 400, and depicted in an image.

In step 1040, the identified (step 1020) and measured defect(s) 580 (step 1030) are imaged with a scanning particle microscope 420, for example the SEM of the microscope system 400. In case the AIMS™ tool is used as inspection tool, or if different upstream inspection tools, e.g., on the basis of an SEM will in the future provide a sufficient resolution for the imaging of the defects 580, the defect 580 or the defects 580 may also be imaged directly with the inspection tool and the steps 1020 and 1040 may coincide.

Now, the requirements for employing the inventive correlation method in step 1050 are met. In step 1050, the images of a scanning probe microscope 440 and/or a scanning particle microscope 420 are correlated to one another or are transformed into one another with the help of the above described correlation unit 485.

In step 1060, a repair tool uses the images 500, 650 aligned to each other in order to repair the defect(s) 580. In a preferred embodiment, a scanning particle microscope and a scanning probe microscope are integrated into the repair tool such that defect(s) 580 of the photomask 510 can be analyzed and repaired in a single tool.

In the flow diagram 1000 of FIG. 10, the steps 1020 to 1040 are preparatory steps for employing the inventive method and the step 1060 is the actual repair process. For example, these steps may lie outside of the inventive correlation method and are therefore shown dotted lines in FIG. 10.

The present application describes a correlation unit 485 which is able to transform images that have been recorded by one or more microscope systems into each other with great accuracy without markers having to be applied to a photomask for this end.

What is claimed is:

1. An apparatus for correlating at least two images of a photolithographic mask that at least partially overlap, the apparatus comprising:
 a correlation unit that is provided to use at least one random variation, which is present in the at least two images, of at least one structural element of the photolithographic mask for the correlation of the at least two images, in which the correlation unit is configured to use information about the at least one random variation of the at least one structural element in a first of the at least two images and information about the at least one random variation of the at least one structural element in a second of the at least two images to correlate the at least two images, wherein the at least one random variation of the at least one structural element forms a marker that is always present on the photolithographic mask, and thus avoiding applying a marker being visible in the at least two images for correlating the at least two images, wherein the correlation unit is provided to generate from at least a first of the at least two images a simulation of a second of the at least two images, and wherein the simulated image is used for the correlation of the first and the second image.

2. The apparatus according to claim 1, wherein at least one image of the at least two images is recorded by a particle microscope.

3. The apparatus according to claim 2, wherein the particle microscope uses at least one of electrons, ions, or photons for the imaging of the photo-lithographic mask.

4. The apparatus according to claim 1, wherein at least one image of the at least two images is recorded by a scanning probe microscope.

5. The apparatus according to claim 4, wherein the scanning probe microscope comprises at least one of an atomic force microscope, a scanning tunneling microscope, a magnetic force microscope, a near-field scanning optical microscope, a near-field scanning acoustic microscope, or a scanning capacitance microscope.

6. The apparatus according to claim 1, wherein the correlation unit is provided to correlate at least two images that have been recorded temporally shifted by the same particle microscope or scanning probe microscope.

7. The apparatus according to claim 1, wherein the at least partial over-lap of the at least two images comprises at least an overlap region equal to or greater than 20% of the area of the smallest image.

8. The apparatus according to claim 1, wherein the at least partial over-lap of the at least two images comprises at least an overlap region equal to or greater than 40% of the area of the smallest image.

9. The apparatus according to claim 1, wherein the at least partial over-lap of the at least two images comprises at least an overlap region equal to or greater than 60% of the area of the smallest image.

10. The apparatus according to claim 1, wherein the at least partial over-lap of the at least two images comprises at least an overlap region equal to or greater than 80% of the area of the smallest image.

11. The apparatus according to claim 1, wherein the at least one random variation of the at least one structural element comprises a random deviation of at least one periodic structural element.

12. The apparatus according to claim 1, wherein the at least one random variation comprises a surface roughness of the at least one structural element.

13. The apparatus according to claim 12, wherein the surface roughness comprises an edge roughness of the at least one structural element.

14. The apparatus according to claim 1, wherein the at least one random variation comprises a granular structure of the at least one structural element.

15. The apparatus according to claim 1, wherein the correlation unit is provided to determine a transformation which transforms the at least two images into each other.

16. The apparatus according to claim 15, wherein the correlation unit is provided to determine the transformation in a two-stage process: in a first step by using the at least one random variation of the at least one structural element, and in a second step on a pixel-by-pixel basis.

17. The apparatus according to claim 1, wherein the correlation unit is further provided to determine a quality factor of the performed correlation.

18. The apparatus according to claim 1, wherein the correlation unit is provided to determine, from at least one image having been recorded by a scanning probe microscope, at least one simulated image of a particle microscope.

19. The apparatus according to claim 18, wherein the correlation unit is provided for correlating at least one simulated image of the particle microscope and at least one image recorded by the particle microscope.

20. The apparatus according to claim 1, wherein the correlation unit is provided to determine, from at least one image having been recorded by a particle microscope, at least one simulated image of a scanning probe microscope.

21. The apparatus according to claim 20, wherein the correlation unit is provided for correlating at least one simulated image of the scanning probe microscope and at least one image recorded with the scanning probe microscope.

22. The apparatus according to claim 1, further comprising: means for correcting at least one defect of the photolithographic mask that is present in at least one of the at least two images.

23. A method for correlating at least two images of a photolithographic mask that at least partially overlap, the method comprising:
    correlating the at least two images using at least one random variation, which is present in the at least two images, of at least one structural element of the photolithographic mask, including using information about the at least one random variation of the at least one structural element in a first of the at least two images and information about the at least one random variation of the structural element in a second of the at least two images to correlate the at least two images, wherein the at least one random variation of the at least one structural element forms a marker which is always present on the photolithographic mask, and thus avoiding applying a marker being visible in the at least two images for correlating the at least two images;
    wherein the correlating comprises generating from at least a first of the at least two images a simulation of a second of the at least two images, and using the simulated image for the correlation of the first and the second image.

24. The method according to claim 23, wherein the method further makes use of an apparatus.

25. The method according to claim 23, further comprising correcting at least one defect of the photolithographic mask that is present in at least one of the at least two images.

26. A non-transitory computer readable medium storing a computer program comprising instructions that when executed by a computer, cause the computer to:
    correlate at least two images of a photolithographic mask that at least partially overlap, including correlating the at least two images using at least one random variation, which is present in the at least two images, of at least one structural element of the photolithographic mask, including using information about the at least one random variation of the at least one structural element in a first of the at least two images and information about the at least one random variation of the at least one structural element in a second of the at least two images to correlate the at least two images, wherein the at least one structural variation of the at least one structural element forms a marker which is always represent on the photolithographic mask, and thus avoiding applying a marker being visible in the at least two images for correlating the at least two images;

wherein the correlating comprises generating from at least a first of the at least two images a simulation of a second of the at least two images, and using the simulated image for the correlation of the first and the second image.

27. The apparatus according to claim 2, wherein at least another image of the at least two images is recorded by a scanning probe microscope.

28. The apparatus according to claim 11, wherein the at least one random variation comprises a surface roughness of the at least one structural element.

29. The apparatus according to claim 28, wherein the at least one random variation comprises a granular structure of the at least one structural element.

30. The apparatus according to claim 1, wherein the correlation unit is provided to determine, from at least one image having been recorded by a particle microscope, at least one simulated image of a scanning probe microscope.

31. The apparatus according to claim 30, wherein the correlation unit is provided for correlating at least one simulated image of the particle microscope and at least one image recorded by the particle microscope.

32. The apparatus according to claim 31, wherein the correlation unit is provided for correlating at least one simulated image of the scanning probe microscope and at least one image recorded with the scanning probe microscope.

33. The apparatus of claim 1, wherein the at least one random variation is allowed by a specification of the photolithographic mask.

34. The method of claim 23, wherein the at least one random variation is allowed by a specification of the photolithographic mask.

35. The non-transitory computer readable medium of claim 26, wherein the at least one random variation is allowed by a specification of the photolithographic mask.

* * * * *

UNITED STATES PATENT AND TRADEMARK OFFICE
CERTIFICATE OF CORRECTION

PATENT NO. : 9,990,737 B2  
APPLICATION NO. : 14/568681  
DATED : June 5, 2018  
INVENTOR(S) : Dieter Weber and Markus Waiblinger Page 1 of 1

It is certified that error appears in the above-identified patent and that said Letters Patent is hereby corrected as shown below:

On the Title Page

<u>Column 1</u>
Item (Notice), Line 3, after "0 days." delete "days."

In the Specification

<u>Column 7</u>
Line 16, delete "CLEAR-CERAM®." and insert -- CLEARCERAM®. --

Signed and Sealed this
Twenty-fifth Day of September, 2018

Andrei Iancu
*Director of the United States Patent and Trademark Office*